[54] CONTACTLESS FACILITIES FOR DETERMINING THE SPECIFIC RESISTANCE OF A TEST SAMPLE

[75] Inventor: Milos Jurca, Prague, Czechoslovakia

[73] Assignee: CKD Praha, oborovy podnik, Prague, Czechoslovakia

[21] Appl. No.: 728,839

[22] Filed: Oct. 1, 1976

[30] Foreign Application Priority Data

Oct. 1, 1975 Czechoslovakia .................. 6635/75

[51] Int. Cl.$^2$ ............................................. G01R 27/02
[52] U.S. Cl. .................................. 324/62; 324/57 Q; 324/61 QL
[58] Field of Search ................ 324/62, 61 QL, 61 QS, 324/57 Q

[56] References Cited

U.S. PATENT DOCUMENTS

| | | | |
|---|---|---|---|
| 3,151,292 | 9/1964 | Orr ........................ | 324/57 Q |
| 3,234,461 | 2/1966 | Trent et al. ................. | 324/62 R |
| 3,400,331 | 9/1968 | Harris ....................... | 324/61 QS |
| 3,437,920 | 4/1969 | Anderson ................... | 324/61 QL |
| 3,544,893 | 12/1970 | Savin et al. ................. | 324/62 R |
| 4,000,458 | 12/1976 | Miller et al. ................ | 324/62 X |

*Primary Examiner*—Stanley T. Krawczewicz

[57] ABSTRACT

A rapid and accurate technique for generating indications representative of the specific resistance of a test sample, such as a silicon disc, is described. A capacitive probe is electrostatically coupled to the sample, and the input terminals of the probe are coupled to the output terminals of a reactive circuit that is excited with a high-frequency current and that includes a capacitive path connected across an input coil to transform the measured loss resistance of the sample (proportional to the specific resistance) to the terminals of the first coil. An auxiliary path including a pair of serially connected compensating inductors is connected between the junction of the capacitors in the capacitive path and a reference terminal of the input coil, with the junction of the compensating coils and the reference terminal forming the output of the reactive circuit. When the compensating inductances are individually adjusted to resonate with the coupling capacitance between the probe and the test sample and with the probe capacitance, respectively, at the frequency of excitation of the reactive circuit, the change in voltage across the capacitive path when the probe is connected to the output of the reactive circuit varies as a function of the specific resistance of the sample.

9 Claims, 8 Drawing Figures

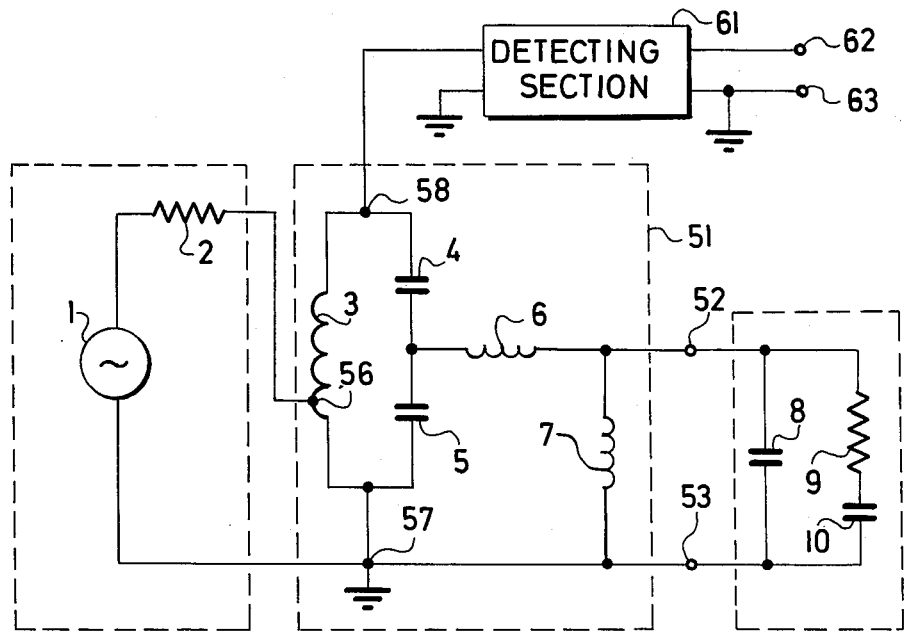
FIG.1
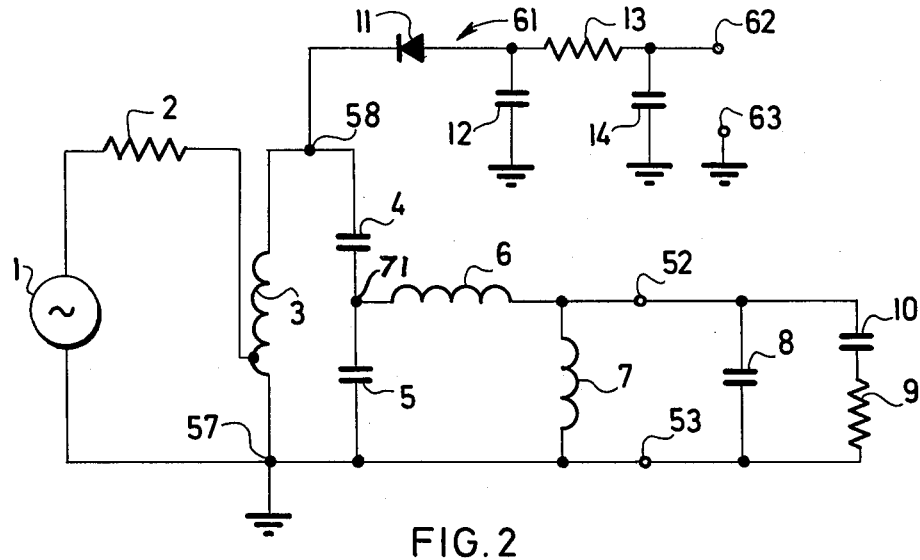
FIG.2
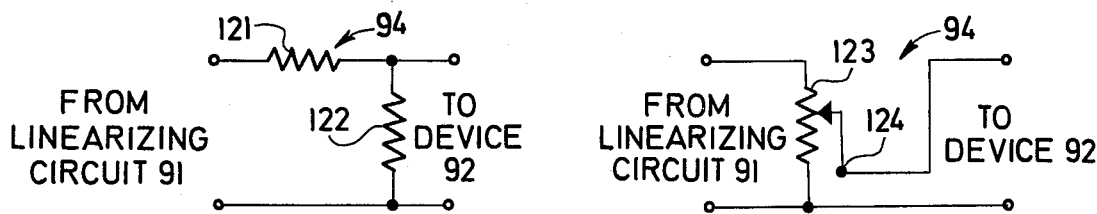
FIG.5
FIG.6

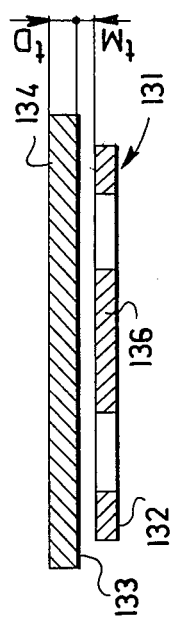
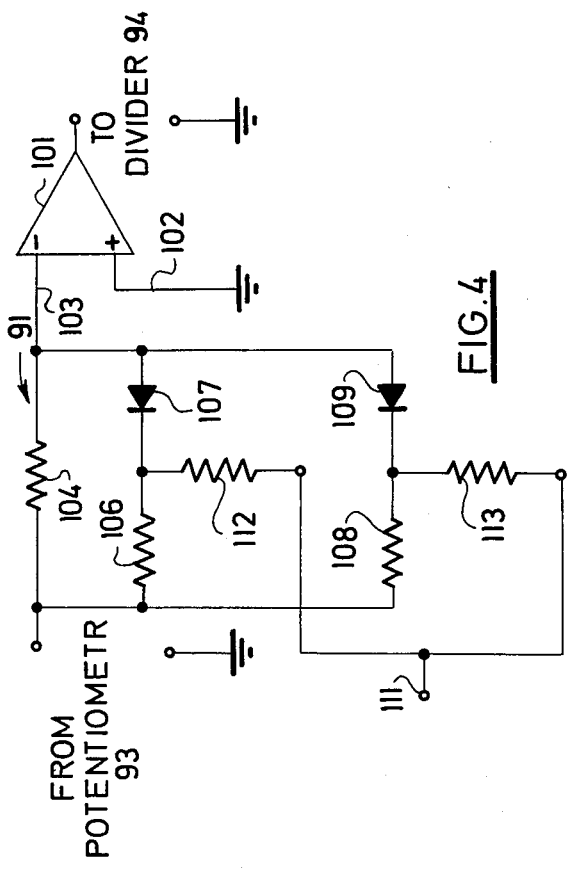
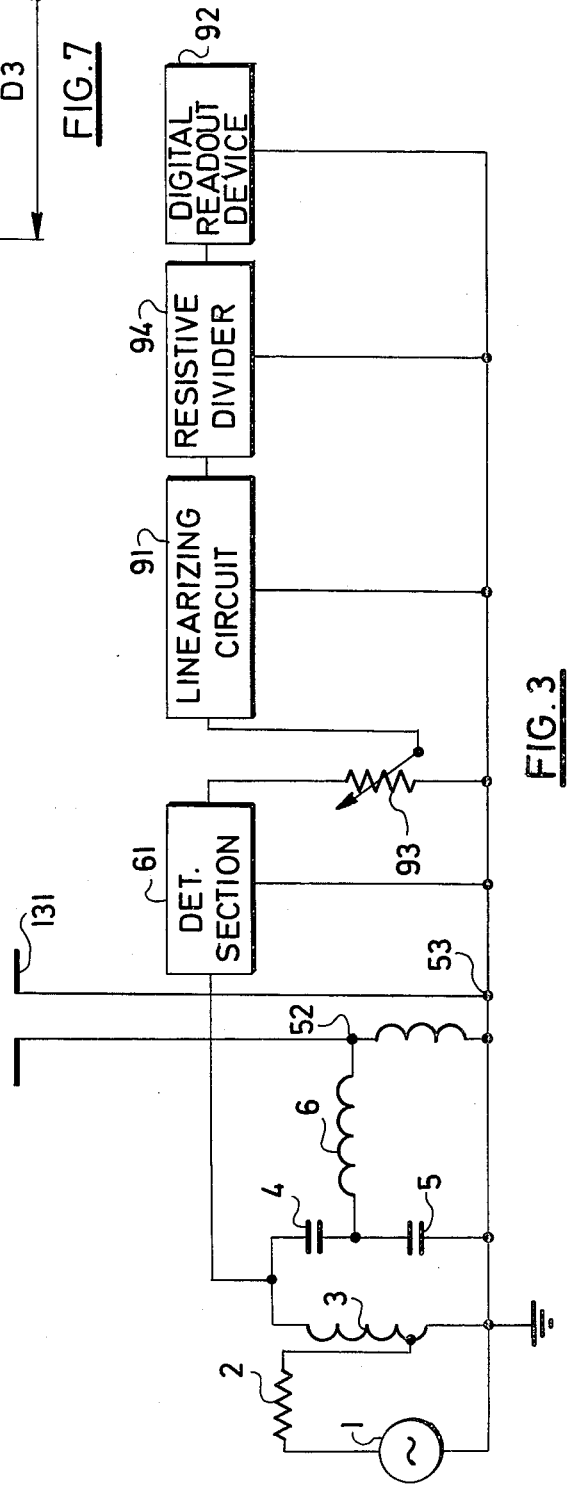

CONTACTLESS FACILITIES FOR DETERMINING THE SPECIFIC RESISTANCE OF A TEST SAMPLE

BACKGROUND OF THE INVENTION

The invention relates to techniques for determining the specific resistance of a test sample, such as a silicon disc, and more particularly to techniques of this type which perform such measurements without the necessity of contact with the surface of the test sample.

Commonly known techniques of this latter type conventionally operate by sensing the change in voltage of a resonant circuit when a pair of specified terminals of such circuit is coupled to a test probe that is brought into reactive coupling relation with the test sample. Such known circuits have the disadvantages of being relatively time-consuming in operation and complicated in form, due to the necessity of providing special indicator scales or correction diagrams to compensate for observed non-linearities between variations in the specific resistance of the test sample and the resulting variations in voltage at the output of the measuring circuit. In addition, the accuracy of such known techniques is not only low in an absolute sense, but also varies as a function of the then-occurring magnitude of the specific resistance of the test sample.

SUMMARY OF THE INVENTION

Such disadvantages are overcome by the method of and apparatus for the contactless determination of the specific resistance of a test sample in accordance with the invention. In an illustrative embodiment, a capacitive probe is electrostatically coupled to a surface of the test sample, illustratively a disc of silicon or the like. The probe is selectively connectable to a specially constructed reactive circuit, that includes (a) an input first coil having a reference terminal, (b) a pair of serially connected capacitors connected across the first coil, and (c) a pair of compensating coils connected in series between the junction of the capacitors and the reference terminal. The output of the measuring circuit is taken between the junction of the compensating coils and the reference terminal. A high-frequency current is applied to the first coil to yield a measuring voltage across the output of the reactive circuit.

The compensating inductance connected to the junction of the capacitors is adjusted to resonate with the coupling capacitance occurring between the probe and the test sample at the frequency of excitation of the reactive circuit. In like manner, the other compensating inductance is adjusted to resonate with the capacitance of the probe itself at the same frequency. Under such circumstances, the resistive component of the voltage measured across the first coil of the reactive circuit when the probe is connected to the output of the reactive circuit will be a reflected function of the loss resistance of the test sample; and such loss resistance, in turn, is proportional to the specific resistance to be determined.

In order to assure that the voltage appearing across the first coil under load conditions will be a linear function of the reflected specific resistance of the sample, a diode-instrumented detector connected across such first coil has associated therewith a linearizing circuit including an operational amplifier, one of whose inputs is connected to the reference terminal and the other of whose inputs is connected to three parallel-connected paths including a resistance and/or a resistance in series with a diode. The junction of the resistance and diodes in such latter path are excited by a DC current source via associated resistors. The output of the operational amplifier is coupled via a resistive divider to the input of a digital voltmeter, which provides a rapid and accurate indication of the change in reactive circuit voltage representative of the desired specific resistance.

BRIEF DESCRIPTION OF THE DRAWING

The invention is further set forth in the following detailed description taken in conjunction with the appended drawing, in which:

FIG. 1 is a combined block and schematic diagram of a first circuit embodiment for determining the specific resistance of a test sample in accordance with the invention;

FIG. 2 is a schematic diagram illustrating certain of the components of FIG. 1 in more detail;

FIG. 3 is an alternate representation of the circuit of FIGS. 1 and 2, illustrating additional facilities associated with the voltage measuring portions of the circuit for digitally reading out a linearized version of the detected voltage;

FIG. 4 is a circuit diagram of a linearizing circuit suitable for use in the arrangement of FIG. 3;

FIGS. 5 and 6 are first and second embodiments, respectively, of a resistive voltage divider circuit suitable for use in the arrangement of FIG. 3;

FIG. 7 is a cross-sectional view of a capacitive probe suitable for use in the arrangement of FIG. 3; and FIG. 8 is a stylized representation of typical configurations of the test probe of FIG. 7 relative to a test sample whose specific resistance is to be determined, the probe and the sample being disposed in spaced but electrostatically coupled relation.

DETAILED DESCRIPTION

Referring now to the drawing, the circuit of FIG. 1 includes a reactive measuring circuit 51 having a pair of output terminals 52 and 53, across which a capacitive probe (not shown) represented by a capacitance 8 can be selectively connected for determining the specific resistance of a test sample (described below). The input of the circuit 51 is coupled via terminals 56, 57 to the output of a high-frequency generator 1, whose internal resistance is represented by a resistor 2. In the particular embodiment of FIG. 1, the terminal 57 is grounded, while the terminal 56 represents an intermediate tap point of a first coil 3. The outer terminals of the coil 3 are connected to a voltage measuring terminal 58 and the grounded terminal 57, respectively.

The reactive circuit 51 further includes a first path including serially connected capacitors 4 and 5, the outer terminals of such first path being connected across the terminals 58 and 57. The capacitors 4, 5 serve, among other things, to transform a loss resistant component of the test sample to be measured to the terminals 58, 57, where such transformed resistance will represent the effective parallel resistance of a loaded resonant circuit in the manner described below.

A detecting section 61 is connected across the terminals 58, 57 for the purpose of sensing the drop in voltage across such terminals when the probe-connected test sample is coupled across the output terminals 52, 53 of the reactive circuit 51.

As shown best in FIG. 2, the detecting section 61 includes a diode 11 connected to the measuring terminal 58, the output of such diode being coupled to a filter consisting of a first grounded capacitor 12, across which is connected the series combination of a resistor 13 and a second capacitor 14. The output voltage of the detecting section 61, appearing across terminals 62 and 63, may be further processed as discussed below and converted to digital form for a final readout.

The input impedance of the detecting section 61, together with the input impedance of a reactive circuit 51 when tuned to resonance with its output terminals 52, 53 unloaded, are assumed to be substantially infinite. In such case, the reduction in voltage detected by the section 61 when the electrostatically coupled probe and test sample are connected across the output terminals 52, 53 of the circuit 51 will reflect the drop in figure of merit ("Q") of the circuit 51 during the transition from an unloaded to a loaded condition. Since according to conventional principles such drop in "Q" represents the drop in parallel resistance of the resonant circuit when such circuit is loaded, and since the resistive component across the terminals 58 and 57 represents the transformed loss resistance of the test sample when the probe connected thereto is coupled across the output terminals 52 and 53, the resultant drop in "Q" of the circuit 51 when loaded will be a function of the measured loss resistance (hereafter designated $R_S$) of the test sample.

The loss resistance $R_S$ is linearly related to the specific resistance $\rho_S$ to be determined by the relation $$R_S = K\rho_S,$$

where $K$ is a parameter determined by the dimensions and configuration of the probe and the sample. When the probe has a coaxial configuration having an inner conductor whose outer diameter is $D_1$ (FIG. 7) and an outer conductor whose inner diameter is $D_2$, $$K \approx (1/2 \, \pi t_D) \, ln \, (D_2/D_1),$$

where $t_D$ is the thickness of the test sample in cm.

Therefore, the drop in voltage across the terminals 58, 57 during the transition from the unloaded to the loaded condition across the terminals 52, 53 will be a corresponding function of the desired specific resistance.

The loss resistance of the test sample, which is represented by a resistor 9 in FIGS. 1 and 2, is coupled to the terminals 52, 53 via the effective coupling capacitance $C_S$ between the test probe and the sample. Such coupling capacitance is represented by a capacitor 10 in FIGS. 1 and 2; because of the electrostatic coupling between the test sample and the probe, the capacitor 10 is connected in series with the loss resistance 9 across the capacitance 8 representing the capacitance $C_0$ of the probe proper. Such parallel combination, in turn, is connected across the terminals 52 and 53.

In order to compensate for the effect of the capacitance $C_0$ of the test probe and the coupling capacitance $C_S$ between the probe and the test sample, the reactive circuit 51 includes a second path having a pair of serially connected reactances 6 and 7 which are connected between a junction 71 of the capacitors 4 and 5 and the grounded terminal 57.

In particular, the reactance 6, which is connected to the junction 71 and which is embodied as shown in FIG. 2 by a coil having an inductance $L_A$, is adjusted to resonate with the coupling capacitance $C_S$ represented by the capacitor 10 at a given frequency F of operation of the high-frequency generator 1. In like manner the reactance 7, which is embodied in FIG. 2 as a coil having an inductance $L_B$, is adjusted to resonate with the probe capacitance $C_0$ represented by the capacitor 8 at the same frequency F. Mathematically, therefore, the respective coils 6 and 7 are adjusted so that $$L_A = 1/[(2\pi F)^2 \, C_S]$$

$$L_B = 1/[(2\pi F)^2 \, C_0]$$

The impedance of the so-compensated parallel circuit representative of the electrostatically coupled probe and test sample, when connected across the terminals 52 and 53 of the reactive circuit 51, will be transformed via the paths including the capacitors 4, 5 and the inductances 6, 7, respectively, into a resistive component across terminals 58, 57, the magnitude of whose voltage will vary in accordance with changes in the "Q" of the circuit 51 as indicated above. In further accordance with the invention, the function of transformation between the output terminals 52, 53 and the voltage-measuring terminals 58, 57 of the circuit 51 may be made substantially linear by interposing a linearizing circuit 91 in the coupling path between the output of the detecting section 61 and the voltage readout device, represented at 92. Such coupling path may also include a potentiometer 93, whose input terminals are coupled directly across the output of the detecting section 61 and whose output terminals are coupled across the input of the linearizing circuit 91. In addition, a resistive voltage divider 94 may be interposed between the output of the linearizing circuit 91 and the input of the readout device 92 to compensate for the thickness $t_D$ of the test sample.

The function of the linearizing circuit 91 is effectively to isolate, from the readout device 92, the non-linear portions of the function of transformation of the loss resistance $R_S$ of the test sample, as seen from the output terminals 52, 53, to the measuring terminals 58, 57. When the inductances $L_A$ and $L_B$ are adjusted as described above, the linear relation between the resistance $R_0$ appearing across the terminals 58, 57 when the electrostatically-coupled test sample is connected via the probe to the output terminals 52, 53 can be represented by the following relation:

$$R_0 \approx R_S (C_1 + C_2/C_1) \, 2$$

where $C_1$ = capacitance of capacitor 4 and $C_2$ = capacitance of capacitor 5.

One embodiment of the linearizing circuit 91 is shown in FIG. 4. An operational amplifier 101 has a first input terminal 102 connected to ground (i.e., the reference terminal 57), and a complementary terminal 103 which is coupled to the output of the potentiometer 93 via three parallel paths. The first path includes a resistor 104. The second path includes a resistor 106 in series with a first diode 107. The third path includes a resistor 108 in series with a diode 109, whose polarity corresponds to that of the diode 107.

A DC voltage excitation terminal 111 is coupled to the junction of the resistor 106 and the diode 107 through a resistor 112. The terminal 111 is also coupled to the junction of the resistor 108 and the diode 109 via a resistor 113. With the polarity of the diodes 107, 109 illustrated, the DC voltage applied to the terminal 111 is of negative polarity.

The output of the linearizing circuit 101 is taken across the output of the operational amplifier 101 as shown.

FIG. 5 illustrates a first embodiment of the resistive voltage divider 94. The output voltage of the linearizing circuit 91 is connected across the series combination of a pair of resistors 121, 122. The output of the circuit 94 is taken across the resistor 122.

A second embodiment of the circuit 94, illustrated in FIG. 6, is defined by a potentiometer 123 whose input terminals are connected across the linearizing circuit 91. The output of the arrangement of FIG. 6 is taken between a tap point 124 of the potentiometer 123 and ground.

FIG. 7 illustrates a capacitive probe 131 of coaxial configuration, and FIG. 8 illustrates the positioning of an outer surface 132 of the probe 131 in electrostatic coupling relation to a confronting surface 133 of a test sample 134, which as indicated above may take the form of a disc having the thickness $t_D$. An active central region 136 of the probe 131 has an area which is typically about 30% of the confronting area of the test sample 134. With the configuration of the probe 131 and the sample 134 indicated in FIGS. 7 and 8, the coupling capacitance $C_S$ therebetween may be represented by the following equation:

$$C_S = \frac{6.95 \times 10^{-12}}{t_M} \left[ \frac{1}{\frac{1}{D_1^2} - \frac{1}{D_3^2 - D_2^2}} \right]$$

where $D_3$ is the outer diameter of the outer conductor of the probe, and $t_m$ is the spacing between the probe and the test sample in meters.

It will be understood that the operating frequency F of the generator 1 may typically be selected to effect resonance of the circuit 51 (FIG. 1) while the output terminals 52, 53 are decoupled from the probe and test sample; in this way, the variation of the "Q" of the circuit 51 during the transition from the unloaded to the loaded condition may be maximized. In addition, it will be understood that the calibrating potentiometer 93 (FIG. 3) can be adjusted such that the voltage read on the scale of the readout device 92 (e.g., a digital voltmeter) is numerically equal to the value of the specific resistance $R_S$ of the test sample 134.

In the foregoing, an illustrative arrangement of the invention has been described. Many variations and modifications, including those in the type and configuration of the test samples, will now occur to those skilled in the art. It is accordingly desired that the scope of the appended claims not be limited to the specific disclosure herein contained.

What is claimed is:

1. In an apparatus for determining the specific resistance of a test sample, a capacitive probe positionable in electrostatic coupling relation to the surface of the sample, a first coil having a reference terminal, a first path connected across the first coil and including first and second serially connected capacitors, a second path including first and second serially connected reactors for compensating the coupling capacitance between the probe and the substrate and the capacitance of the probe, respectively, means for connecting the second path between the junction of the first and second capacitors and the reference terminal, means for connecting the probe between the junction of the first and second reactors and the reference terminal, voltage detecting means connected across the first path, and means for supplying a high-frequency exciting current to the first coil, thereby to vary the voltage across the voltage detecting means as a prescribed function of variations in the specific resistance of the sample.

2. Apparatus as defined in claim 1, in which the first and second reactances respectively comprise second and third coils individually having inductances $L_A$ and $L_B$ so chosen that $$L_A = 1/[(2\pi F)^2 C_S]$$

$$L_B = 1/[(2\pi F)^2 C_0]$$

where $C_S$ is the coupling capacitance between the probe and the sample, $C_0$ is the capacitance of the probe, and F is the frequency of the exciting current.

3. Apparatus as defined in claim 2, further comprising voltage readout means, and first means for coupling the output of the detecting means to the voltage readout means.

4. Apparatus as defined in claim 3, in which the voltage readout means is a digital voltmeter.

5. Apparatus as defined in claim 3, in which the first coupling means comprises, in combination, an operational amplifier having a first input connected to the reference terminal and a second complementary input; third, fourth and fifth parallel-connected paths serially connected with the second input of the amplifier, the third path including a first resistance, the fourth path including a first diode and a second resistance connected in series, the fifth path including a second diode and a third resistance connected in series, the first and second diodes being poled in similar directions; means including a fourth resistance for applying a DC voltage to the junction of the first diode and the second resistance; means including a fifth resistance for applying said DC voltage to the junction of the second diode and the third resistance; and second means for coupling the output of the amplifier to the input of the voltage readout means.

6. Apparatus as defined in claim 5, in which the second coupling means comprises resistive divider means having an input coupled to the output of the amplifier and an output coupled to the voltage readout means.

7. In a process for determining the specific resistance of a test sample with the use of a reactive circuit which comprises a first coil having a reference terminal, a first path connected across the first coil and including first and second serially connected capacitors, and a second path connected between the junction of the first and second capacitors and the reference terminal and including second and third coils, the output of the reactive circuit appearing between the junction of the second and third coils and the reference terminal, the steps of exciting the reactive circuit with a high-frequency current, measuring the resultant voltage across the output of the reactive circuit, electrostatically coupling the capacitive probe to a surface of the test sample, connecting the electrostatically coupled probe across the output of the reactive circuit to vary the voltage across the first path as a function of the specific resistance of the test sample, and measuring such variation in voltage as an indication of the specific resistance of the test sample.

8. A process as defined in claim 7, further comprising the steps of adjusting the second coil to resonate with the coupling capacitance between the probe and the test sample at the frequency of the exciting current, and adjusting the third coil to resonate with the capacitance of the probe at the same frequency.

9. A process as defined in claim 8, comprising the further step of adjusting, into a linear range, the function between the specific resistance of the test sample and the voltage across the output of the reactive circuit when the probe is connected thereto.

* * * * *